US006656811B2

(12) United States Patent
Swanson et al.

(10) Patent No.: US 6,656,811 B2
(45) Date of Patent: Dec. 2, 2003

(54) CARBIDE EMITTER MASK ETCH STOP

(75) Inventors: Leland S. Swanson, McKinney, TX (US); Gregory E. Howard, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/036,763

(22) Filed: Dec. 21, 2001

(65) Prior Publication Data

US 2003/0119249 A1 Jun. 26, 2003

(51) Int. Cl.$^7$ ............................................. H01L 21/331
(52) U.S. Cl. ........................................................ 438/320
(58) Field of Search ................................. 438/309, 341, 438/320, 931, 933

(56) References Cited

U.S. PATENT DOCUMENTS

| 6,255,211 | B1 | | 7/2001 | Olsen et al. |
| 6,261,892 | B1 | | 7/2001 | Swanson |
| 6,424,044 | B1 | * | 7/2002 | Han et al. |
| 2002/0030280 | A1 | * | 3/2002 | Lee et al. |
| 2002/0037648 | A1 | * | 3/2002 | Nishizawa |
| 2002/0081840 | A1 | * | 6/2002 | Matumoto |

* cited by examiner

*Primary Examiner*—Long Pham
(74) *Attorney, Agent, or Firm*—Yingsheng Tung; Wade James Brady III; Frederick J. Telecky, Jr.

(57) ABSTRACT

Bipolar transistors and methods for fabricating bipolar transistors are disclosed wherein an emitter-base dielectric stack is formed between emitter and base structures, comprising a carbide layer situated between first and second oxide layers. The carbide layer provides an etch stop for etching the overlying oxide layer, and the underlying oxide layer provides an etch stop for etching the carbide layer to form an emitter-base contact opening.

32 Claims, 12 Drawing Sheets

CARBIDE EMITTER MASK ETCH STOP

FIELD OF INVENTION

The present invention relates generally to semiconductor devices and more particularly to formation of emitter-base junctions for bipolar transistors in a semiconductor device.

BACKGROUND OF THE INVENTION

Bipolar transistors are widely employed for switching and amplification of electrical signals in modern semiconductor devices. Such bipolar devices are found in products fabricated using bipolar and BiCMOS processing techniques, which integrates bipolar and CMOS technology. In a BiCMOS device, bipolar transistors are often used for analog signal processing and conditioning, whereas MOS devices are employed for digital signals. NPN bipolar transistors comprise a p-type base situated between an n-type emitter and an n-type collector, whereas PNP type bipolar transistors include an n-type base between a p-type emitter and a p-type collector. Under a forward bias, an NPN collector is at a higher potential than the emitter. Very little electron current flows from the emitter to the collector unless there is a base current. A small base current induces significant electron current to flow from the emitter to the collector. The ratio of the emitter current to the base current is referred to as the transistor gain beta. Thus, the beta or gain of a bipolar transistor is an important performance parameter, and semiconductor manufacturers strive to fabricate devices having consistent and repeatable betas from lot to lot, as well as matched betas within a single device.

Transistor emitter area is another parameter that is important and requires careful control in high performance analog circuits. Currents in various stages of amplifiers are set by current mirrors, which often are strongly dependent on emitter area ratios. Mismatches manifest themselves as input offsets and increased distortion in the amplifier characteristics. Other circuit topologies such as variable gain amplifiers depend on emitter area matching to guarantee the gain vs. voltage control transfer curve specification.

A conventional PNP bipolar transistor structure is illustrated in FIG. 1, and designated generally at reference numeral 30. The bipolar transistor 30 is formed on a lightly doped p-type silicon substrate 2, which may include an isolation region formed therein, for example, a buried oxide layer 4. A p-type collector region 6 is formed over the buried oxide layer 4, and a collector-base interface 8 is defined above the buried oxide layer 4 by the formation of laterally spaced isolation regions 10. The isolation regions 10 may be field oxide (FOX) regions or shallow trench isolation (STI) regions of a generally amorphous microcrystalline structure. An n-type base layer 12 overlies the collector interface 8, which may have a dopant gradient. For example, the base layer 12 may comprise an SiGe strain layer with a graded profile SiGe layer and an intrinsic silicon buffer layer thereon (not shown), wherein the buffer layer serves to accommodate p-type dopant (e.g., boron), which diffuses from a polysilicon emitter 22 into the SiGe strain layer to form an emitter-base junction in the base layer 12. The base layer 12 generally comprises a base epitaxial portion (base epi) 12a with a microcrystalline structure conforming to that of the underlying silicon in the substrate 2, as well as polycrystalline (base poly) portions 12b overlying the isolation regions 10.

An emitter-base dielectric stack 14 is provided over the base layer 12 including a lower oxide layer 18 overlying the base layer 12, a nitride etch stop layer 20 overlying the oxide layer 18, and an upper oxide layer 16 overlying the nitride layer 20. A p-type polysilicon emitter region 22 contacts the base layer 12 through a contact region 24 in the layers 12, 18, and 20, respectively. In the transistor 30, the oxide layer 18 has a thickness 18a of about 150 Å to about 200 Å, the nitride layer 20 has a thickness 20a of between about 500 Å and about 1000 Å, and the oxide layer 16 has a thickness 16a of between about 500 Å and about 1000 Å. The oxide layer 18 typically includes a thermally grown oxide overlying the base layer 12, and may further comprise additional oxide deposited using a TEOS based deposition, so as to provide adequate thickness to about 150 to 200 Å. The thickness of the oxide layer 18 is driven by the need to protect the underlying base layer 12 during etching of the nitride layer 20 to form the emitter-base contact opening, while allowing sufficient overetching to completely etch the nitride thereof.

The structure of the transistor 30 may be created in a variety of ways. In the illustrated device 30, the base layer 12 is formed over the substrate 2 after the isolation regions 10 and the buried oxide layer 4 are created in the substrate 2. The base layer 12 is then deposited. Thereafter, the layers 18, 20, and 16 of the emitter-base dielectric stack 14 are deposited. The base layer 12 is then patterned by forming a patterned resist over the base layer 12 and dielectric stack layers, and the exposed portions of the base poly portions 12b outlying the transistor structure 30, and the dielectric stack above, are removed as illustrated in FIG. 1 using an etch process. Thereafter an opening is formed the stack 14 to define the contact region 24. Once the opening for the emitter-base contact is established, the emitter polysilicon 22 is deposited, after which boron is implanted into the polysilicon 22. The wafer is then heated to thermally diffuse the implanted boron from the polysilicon emitter 22 into the base epi 12a. An emitter-base junction is thus formed, which is ideally below the interface (poly/epi) of the emitter polysilicon 22 and the base epi 12a. In operation, the dielectric stack 14 provides a dielectric insulation between the base and emitter of the device 30 in areas other than the interface region 24.

In order to form an ideal bipolar transistor, the emitter-base junction dimensions need to be precise, so as to provide a predictable and repeatable emitter area. In this regard, better control over the junction dimensions facilitates better matching between devices in a given device, which is desirable in the fabrication of op-amps and other composite devices. Toward that end, the sidewalls of the opening in the insulator layers 18, 20, and 16 are ideally near vertical as illustrated in FIG. 1. However, forming vertical sidewalls requires a generally anisotropic etch process to form the opening for the emitter-base contact. Reactive ion etching (RIE) processes are generally recognized as having desirable anisotropic etching characteristics. Since the RIE processes involve both chemical etching as well as ionic bombardment, it is necessary to take precautions to prevent unwanted bombardment of the underlying base epi material 12a, or worse, etching straight though the dielectric stack and into the base layer.

Thus, an anisotropic RIE process is typically employed to etch an opening through the upper oxide layer 16, using the underlying nitride layer 20 as an etch stop. Thereafter, a second RIE is employed to remove the exposed nitride 20, leaving the thinner oxide layer 18 to protect the base epi 12a from the RIE ionic bombardment. The thinner oxide layer must also function as an etch stop for the nitride etch. Finally, a wet etch process is employed to remove the exposed portions of the layer 18, where the wet etching causes little or no damage to the base epi 12a. Thus, the nitride layer 20 is formed primarily to act as an etch stop layer for the first RIE process, and the lower oxide layer 18 serves as a nitride etch stop and protects the underlying base layer 12 from the adverse effects of the first and second RIE processes.

Difficulties occur when the dielectric stack is over etched and the etch proceeds into the base layer. Significant silicon lattice damage is induced, reducing transistor beta. If the stack is under etched, then only a central portion may at best be opened, and the emitter area is significantly reduced. The percent reduction is then a function of the overall patterned, or desired, emitter area, and not itself constant. Control over transistor matching is then lost or adversely impacted. Good control over the emitter opening etch is critical for control of general transistor matching. The conventional techniques for forming the emitter and the emitter-base contact and junction have heretofore not provided optimal control and repeatability for bipolar transistor emitter area and beta or gain, and further improvement is desirable to provide adequate component matching and process repeatability. Consequently there remains a need for improved methodologies for forming bipolar transistor emitter structures and emitter-base dielectric stacks in bipolar transistors, by which process repeatability and emitter area and beta control can be improved.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The preferred embodiment of this invention relates to fabricating an emitter-base contact opening in a bipolar transistor using an a-SiC:H (SiC or carbide hereinafter as an abbreviation) layer in an emitter-base dielectric stack. Methods are provided for fabricating bipolar transistors wherein an emitter-base dielectric stack is formed between emitter and base structures, comprising a SiC layer situated between first and second oxide layers. The SiC layer provides an etch stop for etching the overlying oxide layer using a first anisotropic etch process, and the underlying oxide layer provides an etch stop for etching the SiC layer to form an emitter-base contact opening using a second anisotropic etch process. The SiC layer and the underlying oxide layer provide improved etch stop capability during the first and second anisotropic etch processes, due to etch selectivities of oxide over SiC, and of SiC over oxide, respectively, which facilitates thinner layers and better process control than that of conventional stacks employing a nitride etch stop layer.

The inventors have found that the conventional dielectric stack suffers from isotropic etch effects in wet etching the lower oxide layer in the base-emitter dielectric stack (e.g., stack 14 of FIG. 1), which hinder efforts at controlling the gain and emitter area of bipolar transistors. In this regard, it is believed that poor etch selectivity for REI etching the upper oxide layer (e.g., layer 16) and the nitride layer (e.g., layer 20) prevent optimization of the final wet etch in forming the emitter-base contact opening, instead requiring a fairly thick lower oxide layer in the base-emitter dielectric stack to compensate for the RIE overetch needed to fully etch through the nitride layer. In addition, it is believed that beta and area control is further exacerbated in the conventional device 30 of FIG. 1 by isotropic etch behavior in the thick lower oxide layer etch, causing diffusion difficulties in forming the emitter-base junction after implantation of the emitter structure.

The present invention advantageously allows improvement in control over bipolar device beta and area as well as improved device matching capabilities through methods for forming emitter-base contact openings. A SiC layer is employed between upper and lower oxide layer as part of an emitter-base dielectric stack, and RIE etching through the upper oxide layer and the SiC layer are performed with etch selectivities beyond those possible using a conventional nitride etch stop layer. Improved etch stop capabilities, in turn, allow thinner oxide layers overlying the base layer in bipolar transistors, so as to mitigate the isotropic etch effects of the final wet etch process employed to open the emitter-base contact opening, while providing protection for the base layer from adverse effects of the anisotropic (e.g., RIE) etch processes. A better etch stop layer will also reduce the chances of over etching into the base layer. The improvement in the anisotropic nature of the removal of material to form the emitter-base contact opening allows better control of the dimensions and electrical characteristics of the emitter-base junction. This, in turn, facilitates better control over the transistor gain (e.g., beta), improved matching of bipolar transistors in a device die, and improved repeatability of the manufacturing process.

In accordance with one aspect of the present invention, methods are provided for fabricating a bipolar transistor emitter and forming an emitter-base dielectric stack therefor. The methodologies comprise forming a first oxide layer over a base layer and forming a SiC layer over the first oxide layer, after which a second oxide layer is formed over the SiC layer. The oxide layers and the SiC layer may be deposited, for example, by plasma enhanced chemical vapor deposition (PECVD) or any appropriate processing techniques. The methods further comprise selectively etching portions of the first and second oxide layers and the SiC layer to expose a portion of the base layer. The upper oxide layer and the SiC layer may be etched using anisotropic etching processes, such as first and second reactive ion etching (RI E) steps, and the lower oxide layer is then etched using a wet etch process, so as to mitigate damage to the underlying base layer in the device. Thereafter, the emitter structure is formed, such as by depositing a polysilicon emitter layer over the exposed portion of the base layer and doping at least a portion of the polysilicon emitter layer.

Another aspect of the invention provides a bipolar transistor, comprising a collector region, a base region formed in a base layer overlying the collector region, and an emitter-base dielectric stack overlying the base layer and comprising an opening therein exposing a portion of the base layer. The emitter-base dielectric stack comprises a SiC layer formed between upper and lower oxide layers. The device further comprises an emitter polysilicon layer overlying the emitter-base dielectric stack and an exposed portion of the base layer.

The lower oxide layer of the stack may be made relatively thin compared with conventional designs, due to the etch selectivity achievable using the SiC layer. Thus, for example, the first oxide layer may be deposited using a TEOS or other process to a thickness of about 70 Å to 100 Å. In this regard, the first oxide layer need not be made thick to compensate for poor etch selectivity associated with conventional stacks employing nitride layers. Furthermore, the intermediate SiC etch stop layer itself may be relatively thin, for example, about 100 Å, while still serving as an effective etch stop with respect to the first RIE etch. The overlying oxide layer in the emitter-base dielectric stack can be made to any thickness appropriate to the particular device design specifications, for example, such as about 500 to 1000 Å.

In another embodiment of the invention, the top oxide layer of the dielectric stack is removed and the SiC layer is thicker than in the above three material stack. In yet another embodiment, the SiC layer (e.g., the layer above the initial oxide layer in the base-emitter dielectric stack) comprises boron carbide (BC).

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
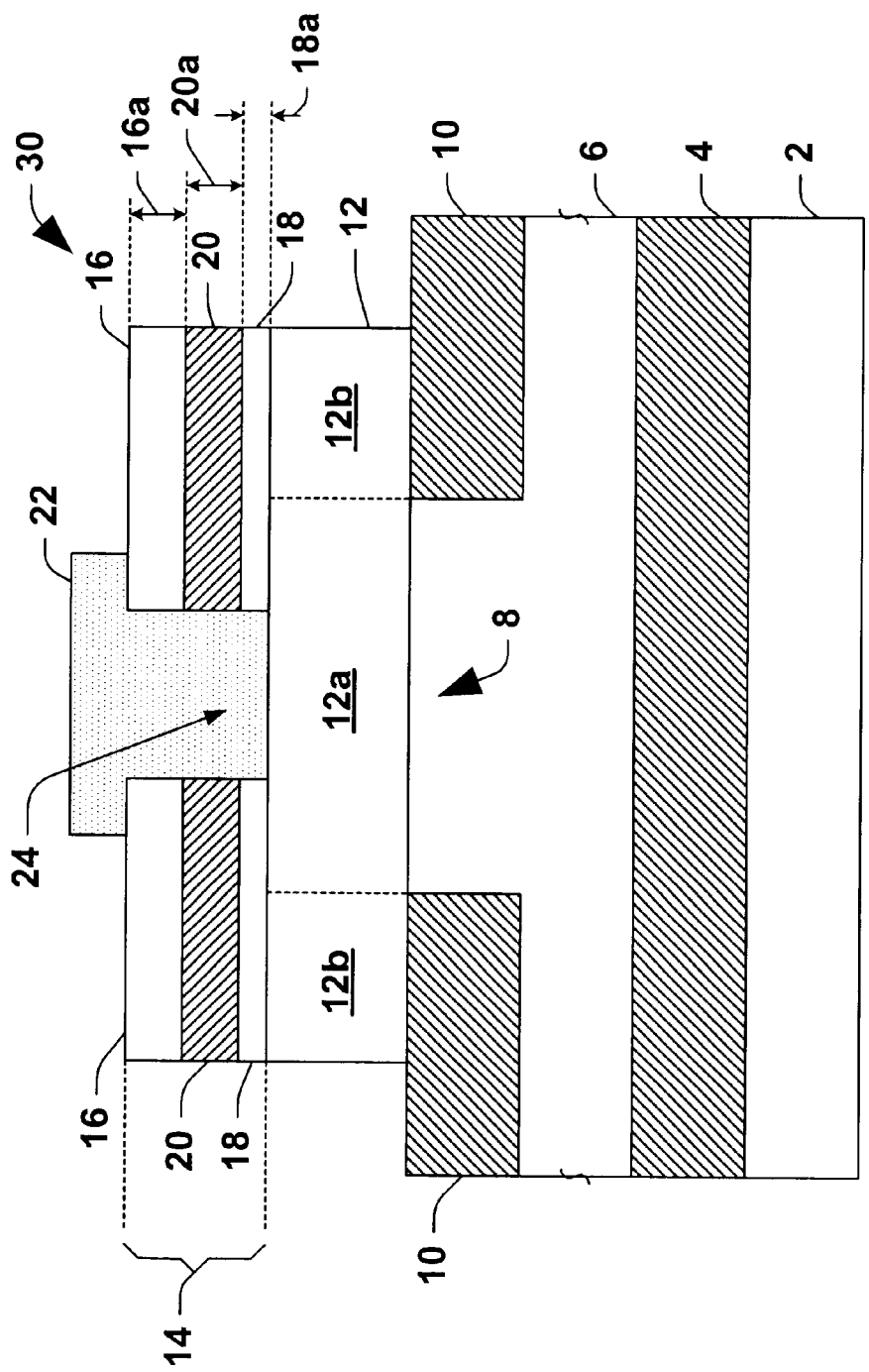
FIG. 1 is a partial side elevation view in section illustrating a conventional bipolar transistor having a nitride etch stop layer used in forming an emitter-base contact opening.

The present invention will now be described with reference to the attached drawings, wherein like reference numerals are used to refer to like elements throughout. The invention relates to bipolar transistors and the use of a carbide layer in an emitter-base dielectric stack to form an emitter-base contact opening. The use of silicon nitride etch stop layers in conventional bipolar device emitter-base stacks has caused troubles in the formation of the emitter-base contact. Referring again to FIG. 1, several problems exist in conventional bipolar transistor fabrication, particularly in forming the opening through the emitter-base dielectric stack 14. As stated above, achieving near vertical sidewalls in the emitter-base opening makes anisotropic (e.g., RIE) etching desirable, leading to the use of the nitride layer 20 as an etch stop. At the same time, however, protection of the underlying base epi requires the lower oxide layer 18, removal of which must be done using a wet etch, which is generally isotropic.

One of the root problems is that the TEOS etches much faster than the thermal oxide, so during the wet etch step, the nitride is undercut, and the thermal oxide on the side develops a taper. The thicker the TEOS and thermal oxide, the greater resulting the taper, and control over the emitter area is degraded. Thus, in order to minimize the isotropic material removal during the wet etch, it is desirable to make the oxide layer 18 as thin as possible while still providing protection to the underlying base epi 12a from the adverse effects of the ionic RIE nitride removal process.

The protection against RIE effects, however, is reduced as the layer 18 is made thinner, due to the need to overetch the overlying nitride layer 20 during the second RIE process. The inventors have appreciated that the amount of required RIE overetch is related to the poor etch selectivity achievable for the RIE etch through the nitride layer 20. For instance, conventional RIE etch processes provide etch selectivity of only about 3:1 to 4:1 for nitride over the underlying oxide material in the layer 18. Hence, the lower oxide layer 18 in the emitter-base dielectric stack 14 needs to be relatively thick to ensure the second RIE clears all the nitride layer 18 without etching through the oxide layer 18, and without unwanted ionic penetration of the base layer 12. As a result, the subsequent isotropic wet etch needs to remove a greater amount of oxide material from the layer 18 to expose the base layer 12, and the sidewalls of the final opening are not nearly vertical.

In addition, the inventors have recognized that where the lower oxide layer 18 includes thermal oxide grown over the base layer 12 as well as an overlying deposited (e.g., TEOS) oxide, that the wet etch tends to cause lateral removal of the TEOS material at a higher rate than that of the thermal oxide. This, in turn, leaves thermal oxide tapered fingers extending laterally inward toward the center of the emitter-base etched opening following the wet etch. These fingers are believed to cause inhomogenaities in the subsequent boron profile following emitter poly deposition because of variances in boron diffusion behavior along the thermal oxide and TEOS oxide taper as the dopant in the emitter is diffused from the emitter poly into the base epi region. Thus, the inventors have appreciated that such inhomogenaities limit the ability to control the bipolar device beta and emitter area (and hence the capacity for device matching and process repeatability), and that improvements are needed over the conventional techniques for fabricating such poly emitter bipolar transistors, so as to provide sufficient process margin for precisely controlling the emitter-base opening (e.g., and hence the beta of the transistor).

First Preferred Embodiment

The present invention addresses these and other problems through use of an amorphous hydrogenated silicon carbide, (a-SiC:H or SiC as an abbreviation) layer in the bipolar emitter-base dielectric stack and appropriate RIE etching in the formation of the emitter-base contact opening. Although illustrated and described below in the context of a particular vertical PNP bipolar transistor architecture, it is to be appreciated that the invention finds application in association with other bipolar designs where polysilicon material is used to form the emitter structure, and that other such applications are deemed as falling within the scope of the present invention and the appended claims. For example, the various aspects of the invention are not limited to bipolar transistors using shallow trench isolation (STI), graded base layer dopant concentrations, buried oxide layers, or the structural dimensions illustrated herein. Moreover, it is noted that the illustrations provided herein are not necessarily to scale.

Figure 2A:
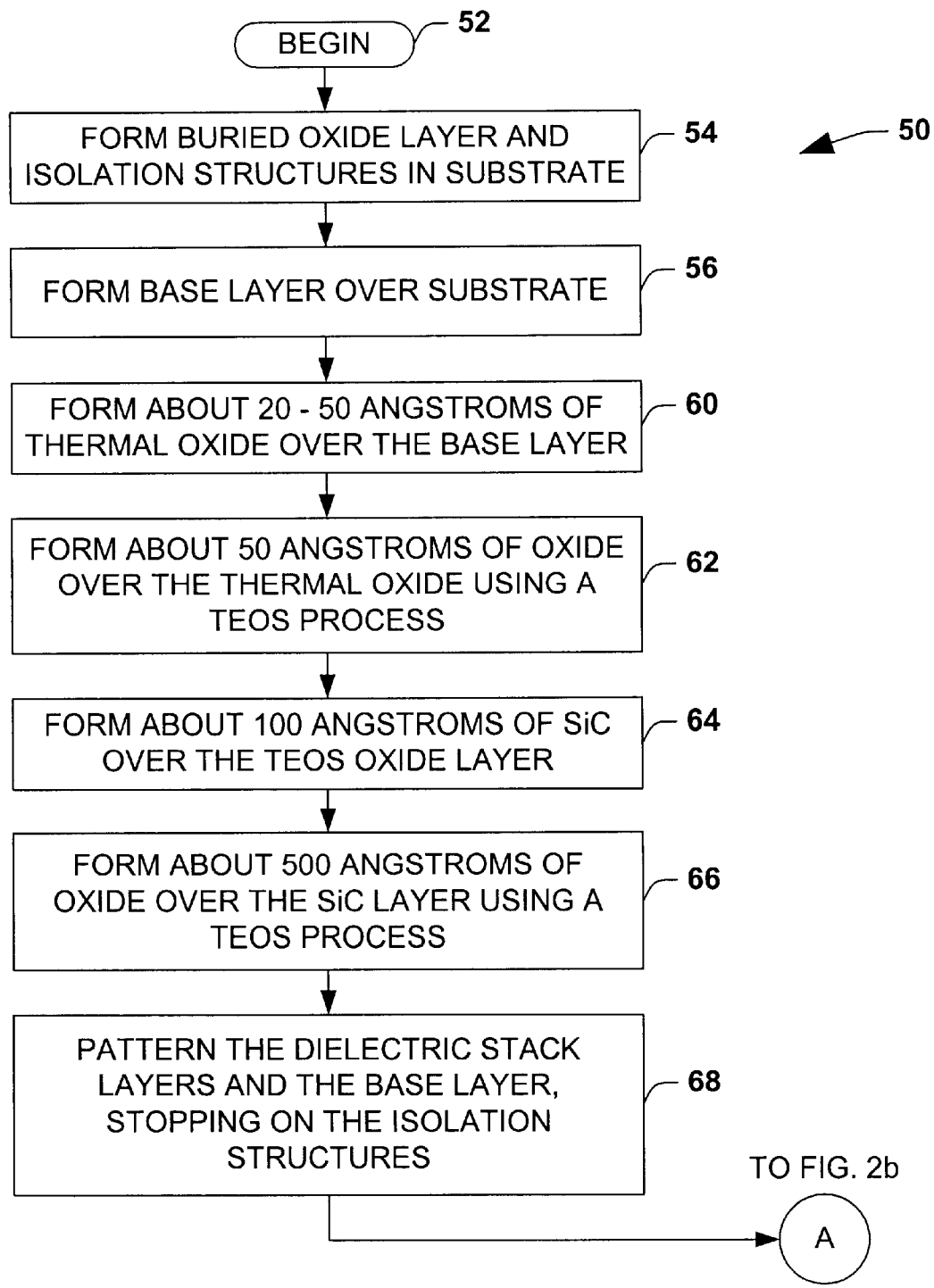
FIGS. 2a and 2b are flow diagrams illustrating an exemplary method of forming an emitter in accordance with an aspect of the invention.
Figure 2B:
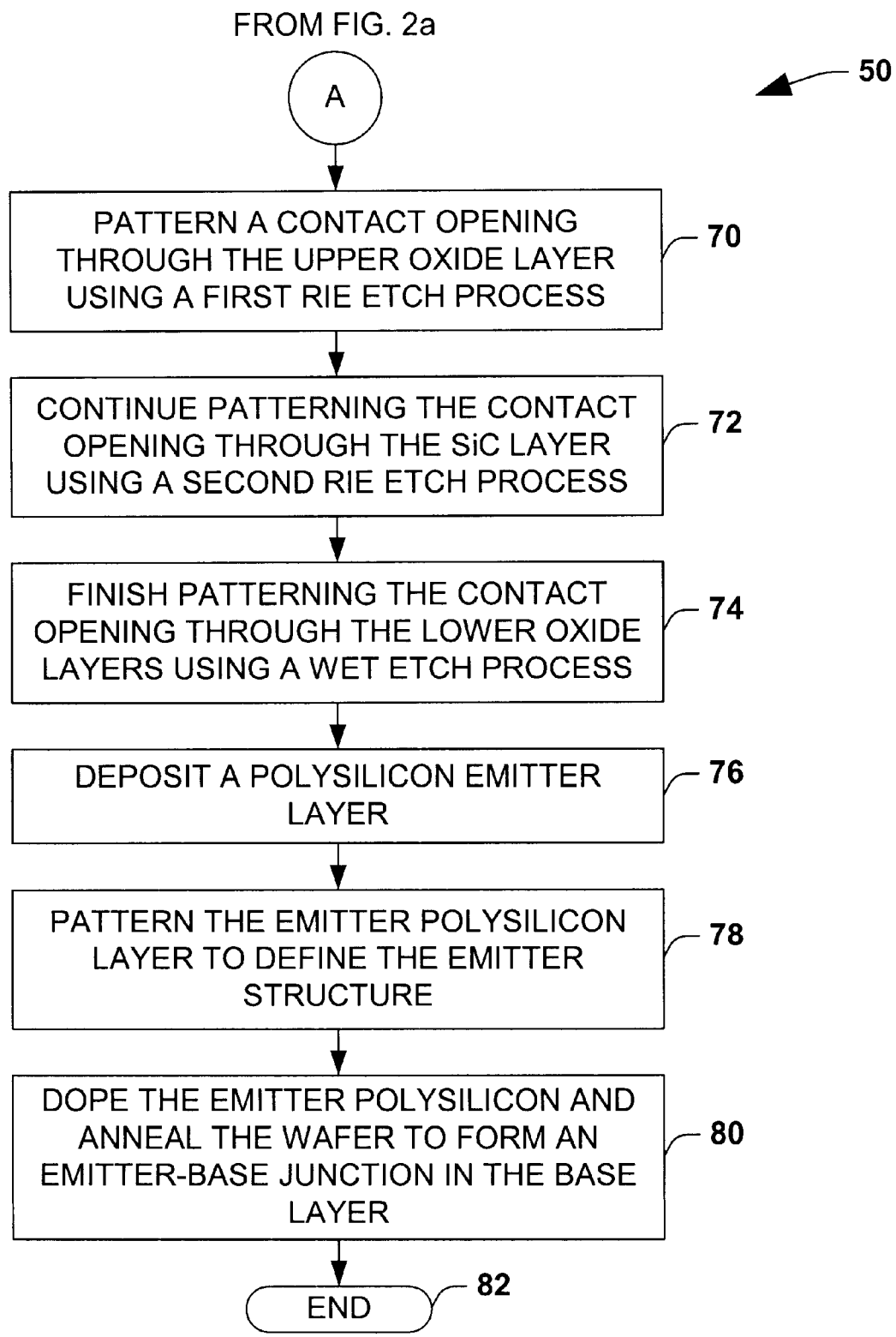

Referring initially to FIGS. 2a and 2b, one aspect of the invention provides methods for forming an emitter structure and emitter-base dielectric stack in which the stack comprises a SiC layer. An exemplary method 50 according to the invention is illustrated in FIGS. 2a and 2b. Although the method 50 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated acts may be required to implement a methodology in accordance with the present invention. Furthermore, the methods according to the present invention may be implemented in association with the formation and/or processing of structures illustrated and described herein as well as in association with other structures not illustrated.

Beginning at 52, the method 50 comprises forming a buried oxide layer and isolation structures in a substrate at 54 and forming a base layer over the substrate at 56. An emitter-base dielectric stack is then formed over the base layer at 60–66 and the base and dielectric stack layers are patterned at 68 as described below. At 60, a thermal oxide layer is formed over the base layer, having a thickness of about 20 Å or more and about 50 Å or less. At 62, further oxide is deposited, such as using a PECVD process, having a thickness of about 100 Å. Thus at 60 and 62, a first oxide layer is formed over the base layer.

At 64, silicon carbide (SiC) layer is formed over the first oxide layer using a PECVD process, although any deposition process may be employed in accordance with the invention. The preferred SiC deposition process would use trimethylsilane as the silicon and carbon source, and a carrier gas of helium, wherein argon, for example, may also be used in place of the He. Examples of other possible source gasses include tetraethylsilane, and silane/methane. It has been found that when depositing with the He, the deposition rates are much reduced, and hence, the thickness of thin layers is better controllable. Even more importantly, the films tend to be denser, and have lower hydrogen content, which significantly increases the film hardness and its resistance to chemical attack. This then reduces the etchability of this material, and improves the etch selectivity of TEOS to SiC. In the illustrated method 50, the SiC layer is formed to a thickness of about 100 Å at 64. However, any appropriate thickness may be used at 64 within the scope of the invention. Thereafter at 66, a second (e.g., upper) oxide layer is formed over the SiC layer, having a thickness of about 500 Å or more and about 1000 Å or less. The upper oxide layer thickness may be adjusted, depending upon the design specifications for a particular transistor device, and any appropriate deposition techniques may be employed (e.g., such as a PECVD deposition process using tetraethylorthosilicate (TEOS) as the silicon source). At 68, the dielectric stack layers (e.g., formed at 60–66 above) and the base layer are patterned, for example, using an etch processes and a resist mask, stopping on the isolation structures, in order to define the base structure.

Referring also to FIG. 2b, the method 50 continues at 70, where a contact opening is patterned in the upper oxide layer using a first reactive ion etch (RI E) process. The selective etch process at 70 may be done in any appropriate manner, preferably providing an etch selectivity of greater than 10:1 of the TEOS oxide to the SiC layer. A typical oxide etch to produce this selectivity would use a combination of one or more of, but not limited to, the following reactive gasses such as $CF_4$, $CHF_3$, and/or $SF_6$, along with $O_2$ and Ar.

At 72, the contact opening is further patterned by etching through the SiC layer using a second RIE etch process. The etch at 72 preferably provides a selectivity of SiC over the underlying oxide of more than about 10:1, and may be more than about 20:1 to expose a portion of the first oxide layer. In the preferred implementation, a chlorine-based etchant is employed to perform the second RIE process at 72. The inventors have appreciated that chlorine has essentially no effect on TEOS or thermal oxide depending on the plasma bombardment component of the RIE etch, while providing an effective etchant with respect to SiC. Thus, when chlorine is used in the second RIE process, silicon chlorides are produced, which become effluent off the surface, leaving carbons. The second RIE may advantageously be performed with about 5 or 10 percent oxygen, which will then ash off the SiC as the silicon is removed from the surface by the chlorine. There is no need to be concerned about ashing the resist, because it could, and preferably should, be removed before the SiC etch step. Resist removal in itself typically involves the use of an ash step, where there is a significant ion bombardment component.

The second RIE etch at 72 may thus balance the silicon and carbon removal rates by the percentage of oxygen in the chlorine-based RIE, wherein the chlorine breaks the silicon/carbon bond in the SiC layer 120. Once it breaks that bond on all sides of the silicon (the carbons and the silicon are generally tetrahedrally bonded) the oxygen is free to bond. Thus, when a carbon is relieved of a silicon atom, the carbon and the oxygen become $CO_2$ or CO, for example, which becomes effluent and is removed from the RIE processing chamber.

Thereafter, a wet etch process is employed at 74 in order to remove a portion of the first oxide layer to expose the underlying base layer. Typically a buffered HF etch is sufficient for this step. The base layer may optionally be subjected to a further step to grow a thermal oxide having a thickness of about 10–20 Å. A polysilicon emitter layer is then deposited at 76 and patterned at 78 to define an emitter structure for the transistor, after which the emitter is doped (e.g., such as by implantation) and thermally annealed so as to form an emitter-base junction in the base layer at 80, before the method 50 ends at 82.

Figure 3:
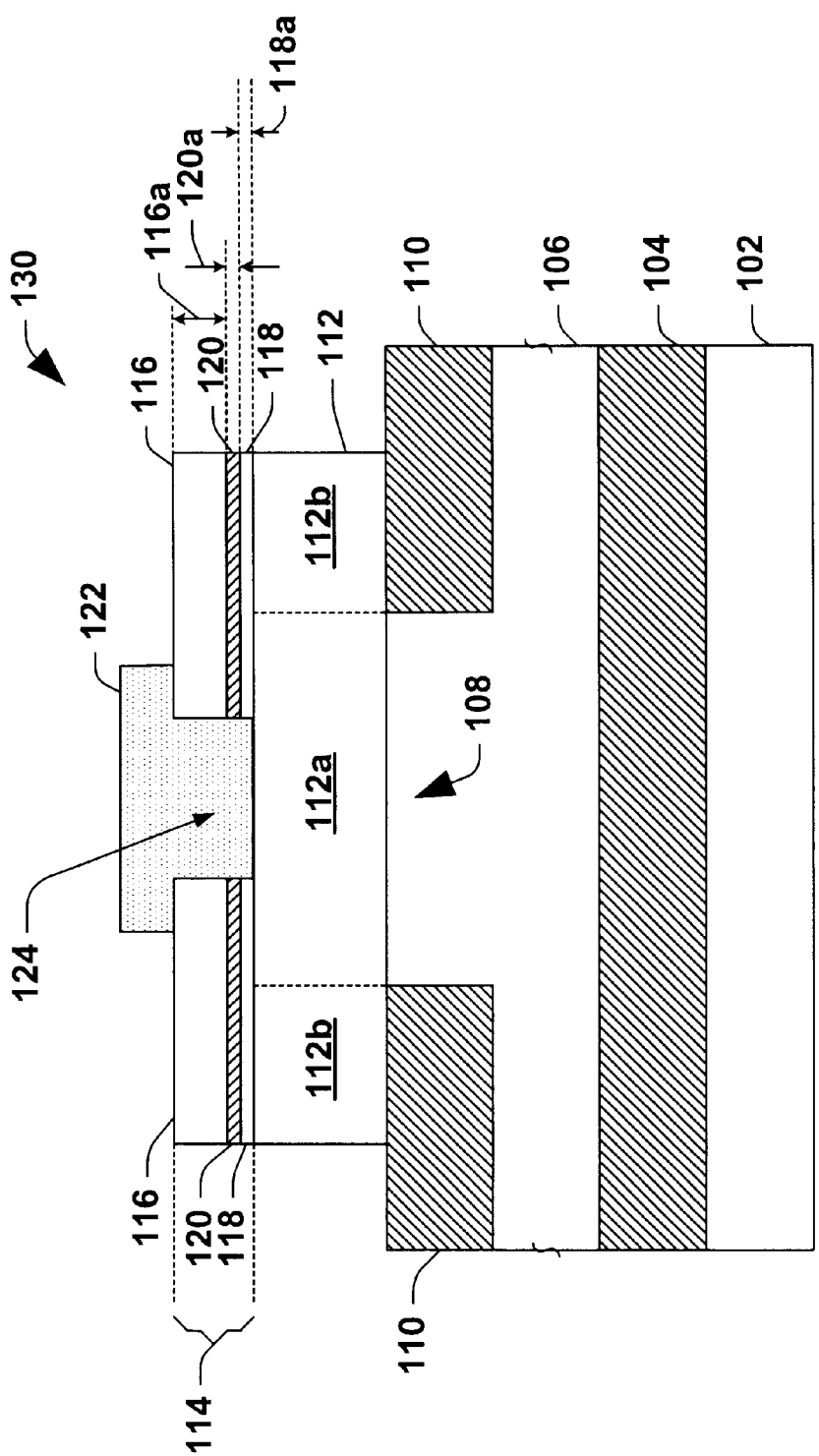
FIG. 3 is an exemplary side elevation view in section illustrating a bipolar transistor having a carbide etch stop layer used in forming an emitter-base contact opening in accordance with another aspect of the present invention.

Referring now to FIG. 3, another aspect of the invention relates to bipolar transistors having a SiC layer within an emitter-base dielectric stack used to form the emitter-base junction. One implementation of a vertical bipolar transistor in accordance with the invention is illustrated and referenced generally at 130. The transistor 130 is a PNP type, and it is noted that the various aspects of the invention may be carried out in association with NPN type bipolar transistors (not shown) as well. The transistor 130 is formed on a lightly doped p-type silicon substrate with an optional buried oxide layer 104. A p-type collector region 106 is located over the buried oxide layer 104, including a collector interface 108 located between laterally spaced isolation regions 110. The illustrated isolation regions 110 are formed using shallow trench isolation (STI) techniques as are known, although other isolation structures such as field oxide (FOX) regions may be alternatively employed, wherein the material in the STI regions 110 has a generally amorphous microcrystalline structure.

An n-type base layer 112 is formed over the collector interface 108 and portions of the isolation regions 110. The base layer 112 may be formed from any appropriate material and may, but need not comprise a dopant concentration gradient. For instance, in the exemplary device 130, the base layer 112 comprises a silicon germanium (SiGe) strain layer with a graded profile SiGe layer and an intrinsic silicon buffer layer thereon (not shown) to accommodate p-type dopant (e.g., boron), which diffuses from a polysilicon emitter 122 into the SiGe strain layer to form an emitter-base junction in the base layer 112. In addition, while formed as a single layer 112, the base layer 112 generally comprises a base epitaxial portion (base epi) 112a with a microcrystalline structure conforming to that of the underlying silicon in the substrate 102, as well as polycrystalline (base poly) portions 112b generally overlying the isolation regions 110.

In accordance with the present invention, an emitter-base dielectric stack 114 is provided over the base layer 112 including a first oxide layer 118 overlying the base layer 112 and a SiC layer 120 overlying the oxide layer 118, which is advantageously employed as an etch stop layer as described further below. A second (e.g., thicker) oxide layer 116 overlies the SiC layer 120 to complete the exemplary emitter-base dielectric stack 114. The first oxide layer 118 has an overall thickness 118a of about 70 Å or more and about 100 Å or less, which may be a single deposited oxide, or may comprise a thermally grown silicon oxide layer (e.g., 20 to 50 Å) overlying the base layer and a first silicon oxide (e.g., about 50 Å thick) deposited over the thermal oxide layer (not shown), as illustrated and described further with respect to FIGS. 9 and 10 below.

It is noted at this point that the invention advantageously allows use of a relatively thin first oxide layer 118, due at least in part to the improved process margins provided by the overlying SiC layer 120 and the improved etch selectivities associated with its use, without sacrificing the ability of the first oxide layer 118 to protect the underlying base layer 112 against adverse effects associated with RIE etching processes associated with creation of an opening for the an emitter-base contact region 124. Thus, whereas the conventional lower oxide layer 18 of FIG. 1 has a thickness 18a of between 150 and 200 Å to accommodate overetch and poor etch selectivity of nitride in the layer 20 over oxide in the layer 18, the exemplary first oxide layer 118 of FIG. 2 may be much thinner, such as between about 70 Å and 100 Å. In this regard, other implementations of the present invention may be carried out wherein first oxide layer thicknesses of less than 70 Å may be achieved. In addition, it is noted that other implementations of the present invention are possible, wherein the layer 120 may comprise a-SiC:H, an a-BC:H layer, or any combination of the two In contrast to the conventional stack 14 of FIG. 1, the exemplary emitter-base dielectric stack 114 of the device 130 comprises a SiC layer 120 by which processing advantages may be realized to facilitate improvements in component matching and repeatability during manufacturing. The layer 120 comprises silicon SiC of a thickness of about 100 Å in the illustrated implementation, although other thicknesses are possible. In the formation of the opening through the stack layer 116, 120, and 118, the SiC layer 120 provides a good etch stop for anisotropic etching of the overlying oxide in the layer 116, wherein RIE or other etching may be used with etch selectivities exceeding 10:1. Because of the etch stop capabilities of the SiC material, the layer 120 may be relatively thin compared to conventional nitride etch stop layers (e.g., nitride layer 20 of FIG. 1). Thus, whereas the conventional nitride etch stop layer 20 has a thickness 20a of about 500 Å to 1000 Å, the exemplary SiC layer 120 of FIG. 3 has a thickness of about 100 Å. As discussed below, the layer 120 may be formed by any appropriate deposition techniques, for example, such as using a plasma enhanced chemical vapor deposition (PECVD) process.

The second or upper oxide layer 116 in the emitter-base dielectric stack 114 comprises a second silicon oxide (SiO2) material overlying the SiC layer, which has a thickness of about 500 Å or more and about 1000 Å or less. Other implementations of the invention may comprise an upper oxide layer in the stack of any appropriate thickness, as determined by other transistor design specifications or process considerations. A p-type polysilicon emitter region 122 is formed over the stack 114 and an exposed portion of the base layer 112 through the contact region 124 in the layers 112, 118, and 120, respectively. For example, polysilicon may be deposited to an appropriate thickness to contact the base layer 112 in the region 124, and the emitter polysilicon may then be doped using appropriate implantation or other techniques. The dopants may then be thermally driven into the base layer 112 to form an emitter-base junction (not shown) below the interface between the base layer 112 and the emitter polysilicon 122.

Figure 4:
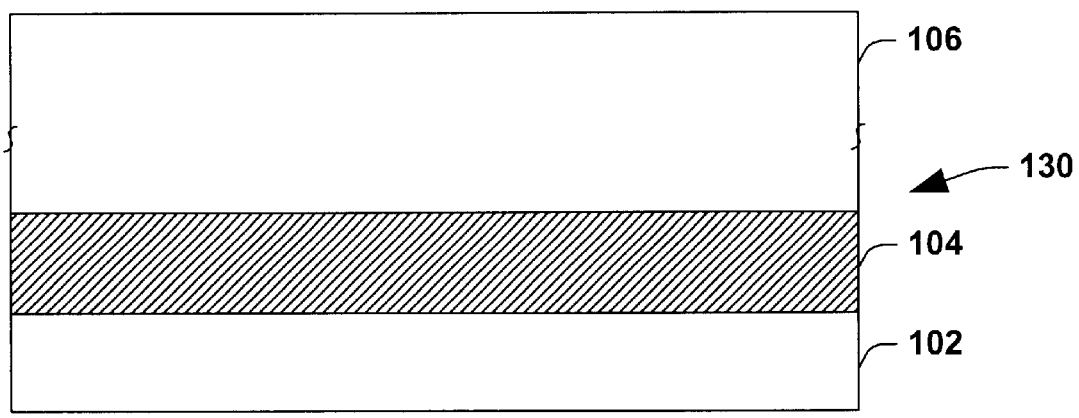
FIG. 4 is a partial side elevation view in section illustrating formation of a collector region in a bipolar transistor device in accordance with the invention.

FIGS. 4–16 and the following discussion further illustrate the various aspects of the invention, in the context of fabricating the exemplary bipolar transistor 130 of FIG. 3 using the method 50 of FIGS. 2a and 2b. However, it is noted that the invention finds application in association with transistor devices and fabrication methodologies apart from those specifically illustrated and described herein. In FIG. 4, the lightly doped p-type substrate 102 is illustrated, wherein a buried oxide layer 104 is formed therein using known techniques to separate the substrate 102 into upper and lower regions. The lower region acts as a device substrate, and the upper region overlying the buried oxide layer 104 defines a lightly doped p-type collector region 106, which in turn may be further doped to a desired dopant concentration according to design specifications for the device 130.

Figure 5:
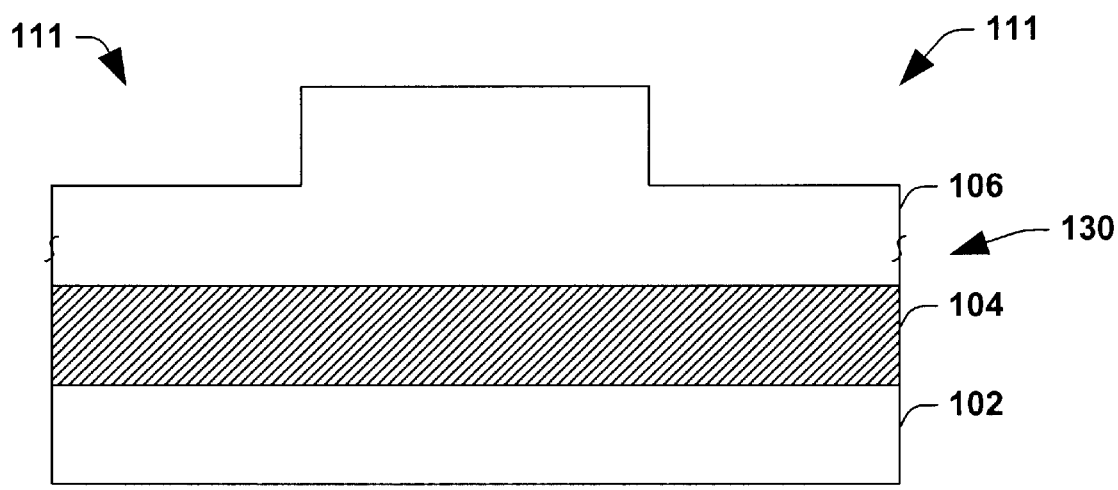
FIG. 5 is a partial side elevation view in section illustrating definition of a collector interface region.
Figure 6:
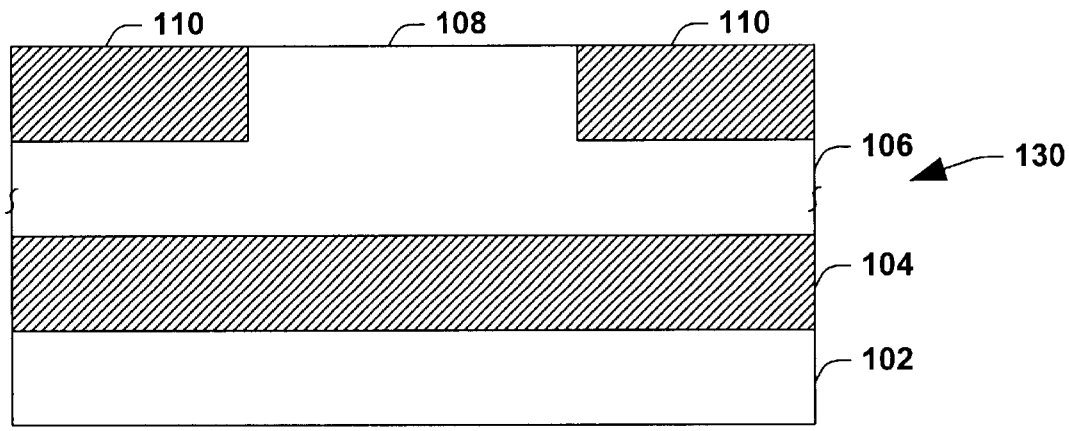
FIG. 6 is a partial side elevation view in section illustrating formation of shallow trench isolation regions.

In FIGS. 5 and 6, the collector region 106 is further defined by formation of isolation regions 110 using shallow trench isolation (STI) techniques as are known. In FIG. 5, for example, trenches 111 are etched into the collector region 106, using a dry etch process (not shown). Thereafter, a deposition process, such as a CVD process (not shown) is employed to form oxide isolation structures 110, which may then be etched or polished (e.g., using a chemical-mechanical polishing (CMP) process, not shown) to provide a substantially planar upper surface for the wafer. The formation of the laterally spaced isolation regions or structures 110 defines the collector interface region 108 as shown in FIG. 6. The isolation regions 110 may alternatively be created using known field oxide (FOX) formation techniques.

Figure 7:
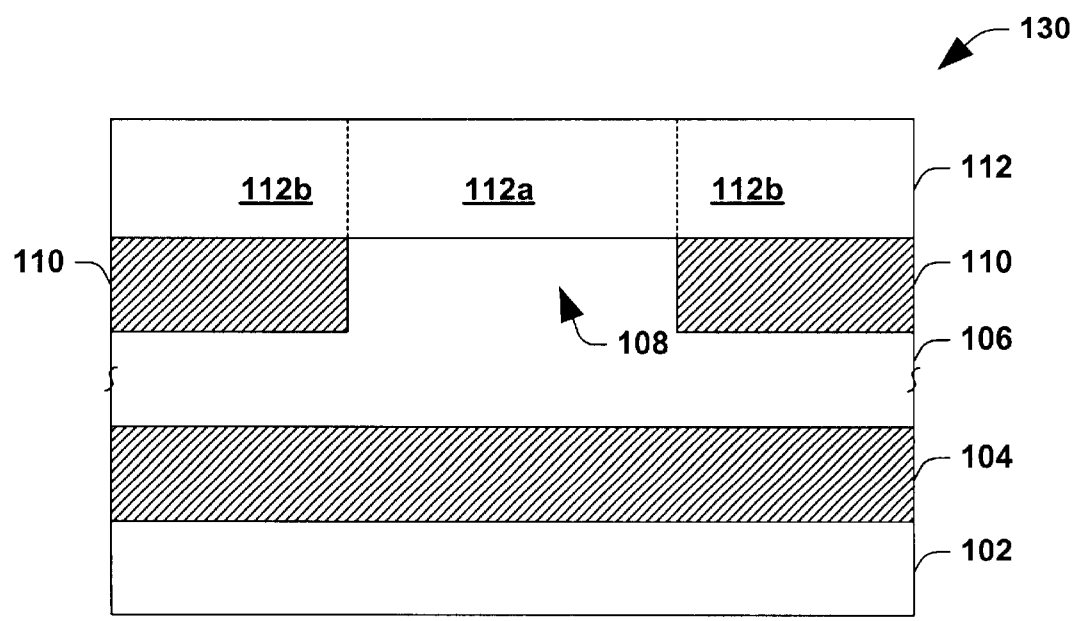
FIG. 7 is a partial side elevation view in section illustrating formation of a base layer in the bipolar transistor of FIGS. 4–6.

Turning now to FIG. 7, a base layer 112 is formed over the collector interface 108 and the isolation regions 110 on the upper surface of the substrate 102. The exemplary base layer 112 comprises a silicon germanium (SiGe) strain layer with a graded profile SiGe layer and an intrinsic silicon buffer layer thereon (not shown), although other base layer structures are contemplated as falling within the scope of the invention. Such an intrinsic silicon buffer layer may be employed so as to accommodate p-type dopant (e.g., boron), which diffuses from a polysilicon emitter 122 (FIG. 3) into the SiGe strain layer to form an emitter-base junction in the base layer 112, as illustrated and described hereinafter with respect to FIG. 16. Any appropriate methodology may be used in forming the base layer 112, including but not limited to a vapor phase epitaxy deposition (VPE) process, limited reaction processing (LRP), molecular beam epitaxy (MBE), laser melting, and the like.

For example, a VPE process may be employed in a pressurized epi-reactor chamber using silicon and germanium gas sources. The grade profile layer of the base layer 112 may be created by dynamic control of the Si and Ge source gases so as to introduce a varying Si/Ge ratio as the epitaxial layer grows, such as initially employing a low Si/Ge ratio, which is increased over time, by which the concentration of Ge in the SiGe alloy decreases as the layer is formed. The exemplary base layer 112 is thus formed to have a thickness of about 1000 Å, although any desired thickness, profile, and materials may be employed. The resulting base layer 112 in FIG. 7 comprises a base epitaxial portion (base epi) 112a with a microcrystalline structure conforming to that of the underlying silicon in the substrate 102, as well as polycrystalline (base poly) portions 112b generally overlying the isolation regions 110.

Figure 8:
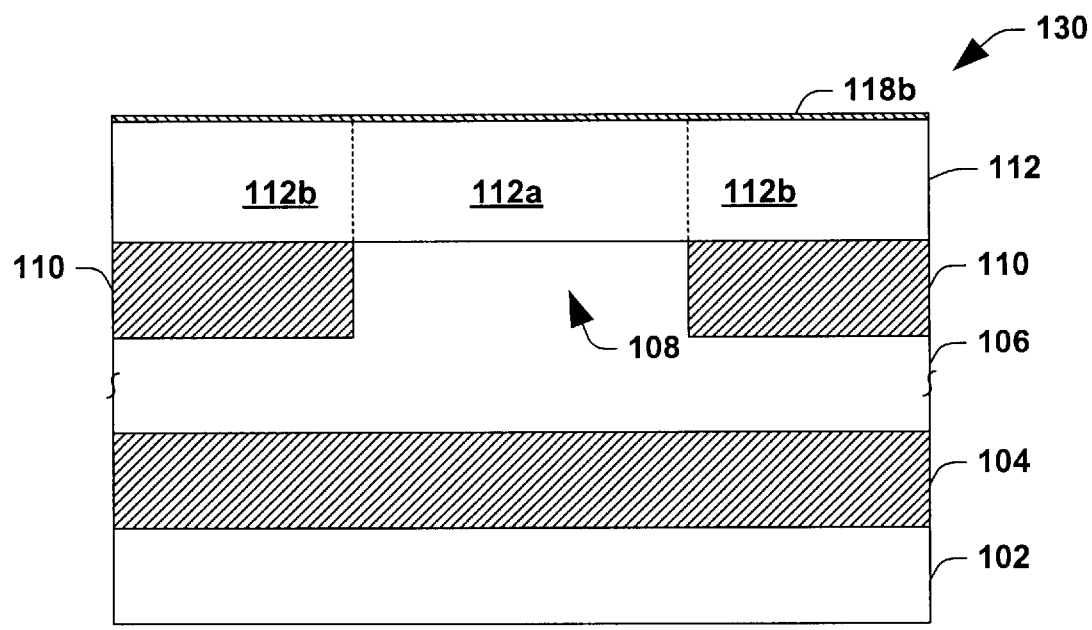
FIG. 8 is a partial side elevation view in section illustrating growth of thermal oxide over the base layer during formation of a first oxide layer according to an aspect of the invention.
Figure 9:
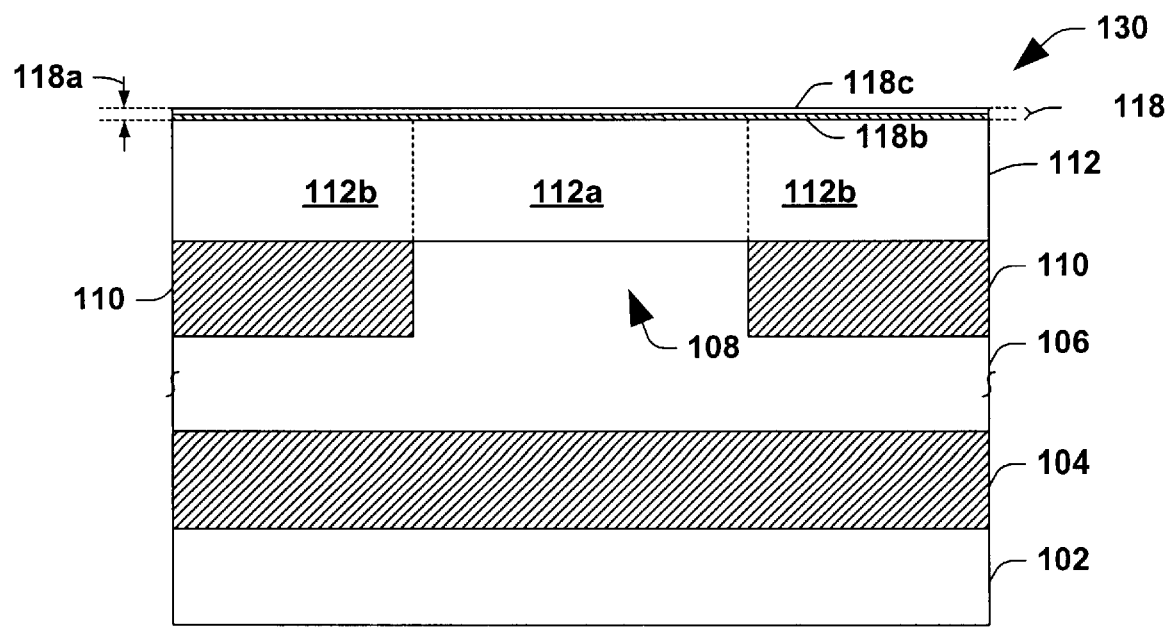
FIG. 9 is a partial side elevation view in section illustrating deposition of a first oxide over the thermal oxide during formation of the first oxide layer.

Turning now to FIGS. 8–12, an emitter-base dielectric stack is then formed over the base layer 112 in order to provide isolation between the emitter and base of the device 130, which will then be patterned to provide an emitter-base contact of a desired dimension. In FIGS. 8 and 9, a first oxide layer 118 is formed over the base layer 112, including a thermal oxide layer 118b (FIG. 8) and a TEOS oxide layer 118c (FIG. 9). The thermal oxide layer 118b is formed (e.g., grown) over the base layer 112 in FIG. 8 to a thickness of about 20 Å or more and about 50 Å or less. Thereafter in FIG. 9, further oxide is deposited as a layer 118c, such as using a TEOS PECVD process, to a thickness of about 50 Å. In this manner, the first oxide layer 118 is formed having a thickness 118a of about 70 Å or more and about 100 Å or less. Alternatively, the first oxide layer 118 may be formed solely through deposition, for example, having a thickness 118a of about 70 Å or more and about 100 Å or less.

Figure 10:
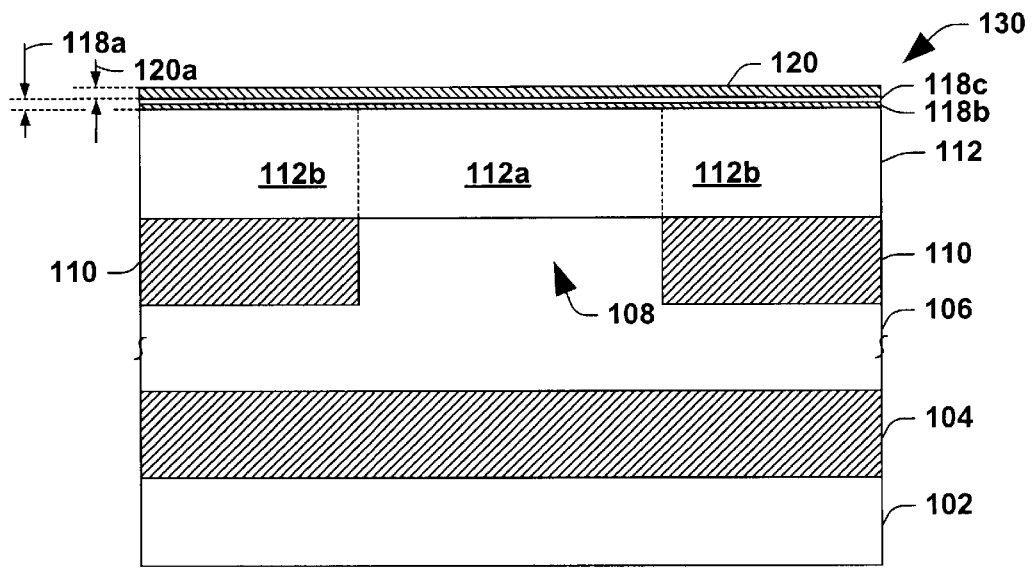
FIG. 10 is a partial side elevation view in section illustrating formation of a carbide (SiC) layer over the first oxide layer according to the invention.
Figure 11:
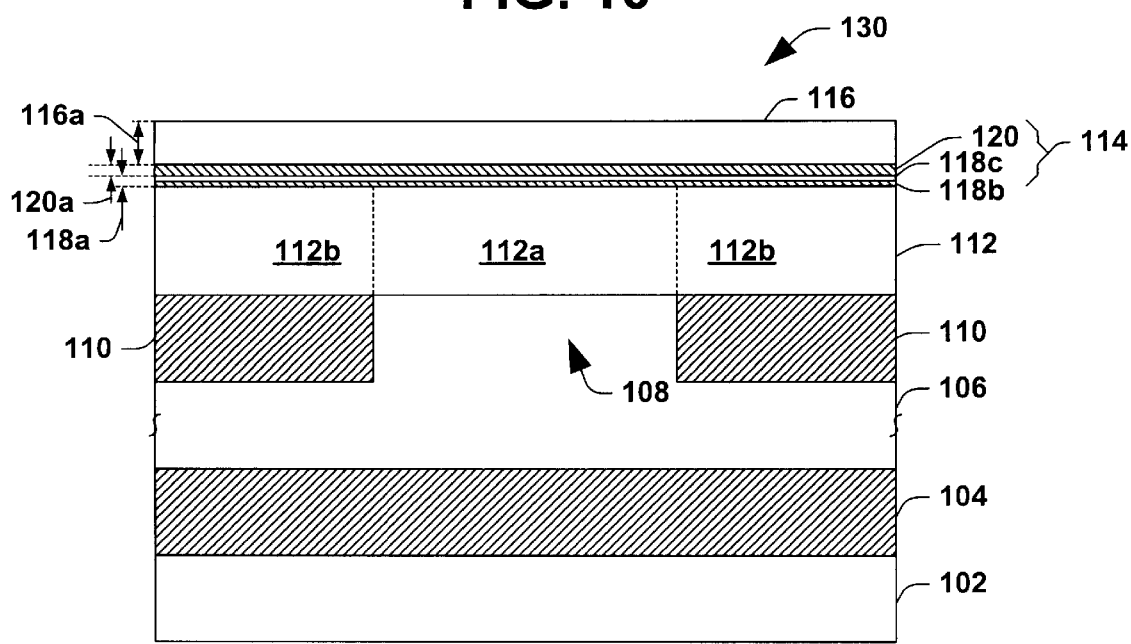
FIG. 11 is a partial side elevation view in section illustrating formation of a second oxide layer over the carbide layer according to the invention.
Figure 12:
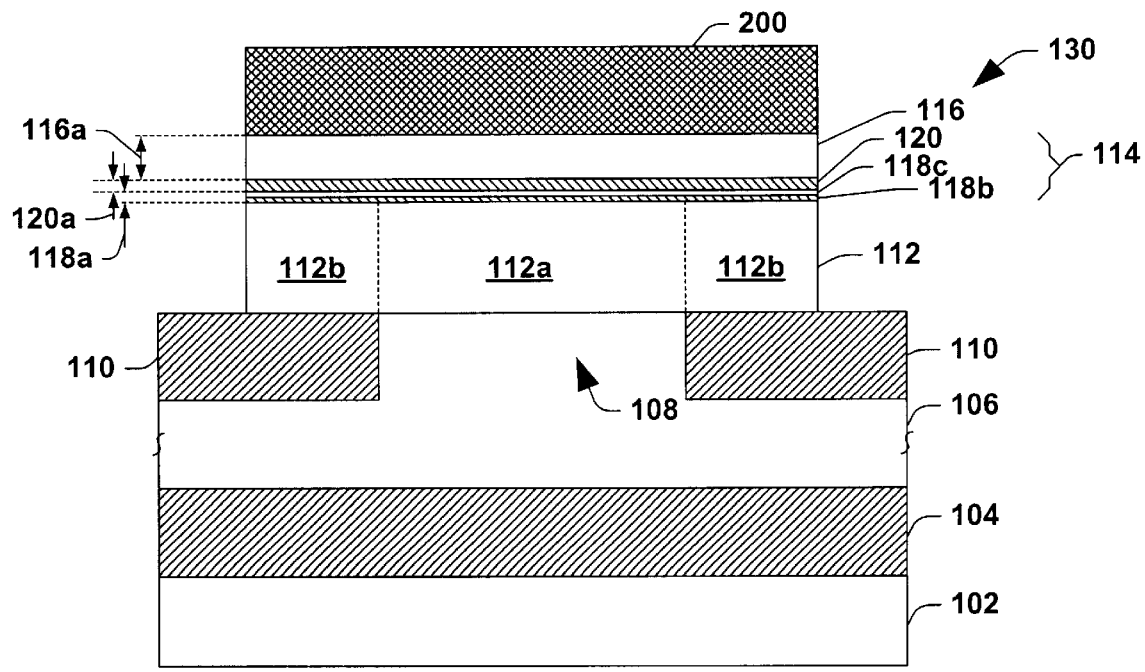
FIG. 12 is a partial side elevation view in section illustrating patterning of the base structure through etching of the dielectric stack and base layers using a first mask.

Thereafter in FIG. 10, a SiC layer 120 is formed of a-SiC:H (SiC hereinafter as an abbreviation) over the first oxide layer 118, for example, using a PECVD process, although any deposition process may be employed in accordance with the invention. The SiC layer 120 has a thickness 120a of about 100 Å, although other thicknesses may be employed. As illustrated in FIG. 11, a second oxide layer 116 is then formed over the SiC layer 120, having a thickness 116a of about 500 Å or more and about 1000 Å or less to complete the emitter-base dielectric stack 114. The thickness 116a may be adjusted according to design specifications for a particular transistor device 130, and any appropriate deposition techniques may be employed, such as a PECVD deposition process using a TEOS as the silicon source. A first mask 200 is then formed over the upper surface of the second oxide layer 116 using any appropriate lithographic process, and the exposed portions of the base-emitter dielectric stack 114 and the base layer 112 are etched to define the base structure illustrated in FIG. 12, stopping on the isolation structures 110.

Figure 13:
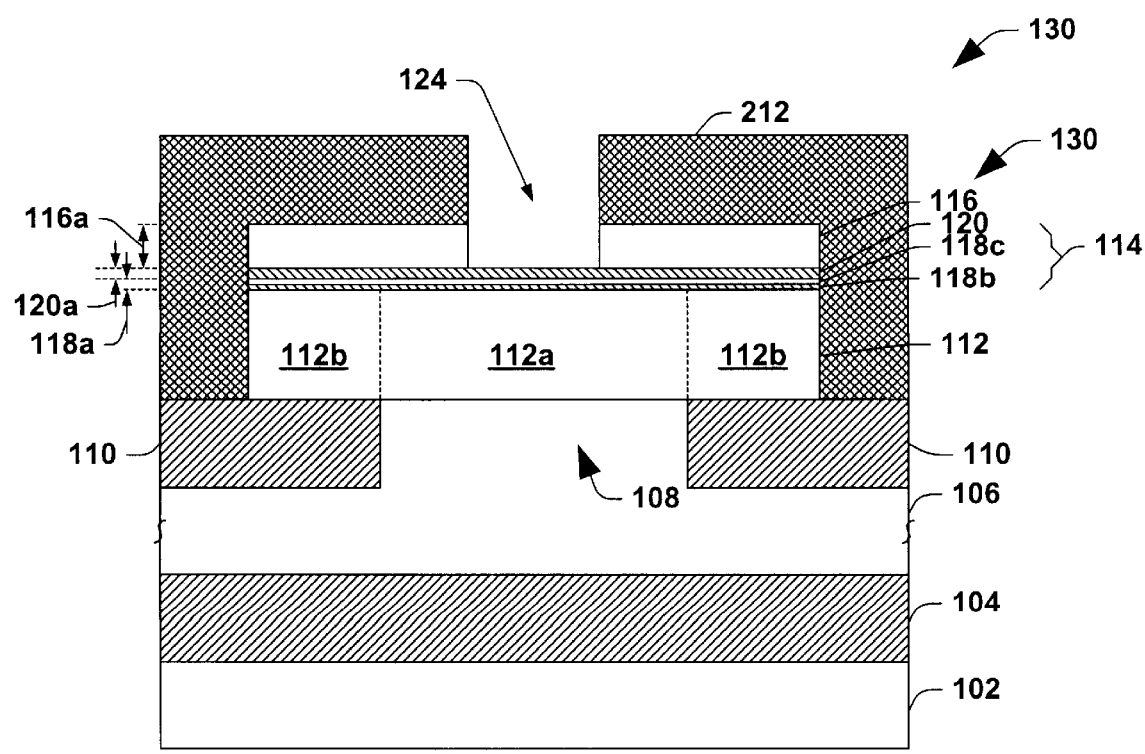
FIG. 13 is a partial side elevation view in section illustrating a patterned first anisotropic RIE etch process through an exposed portion of the second oxide layer to expose a portion of the underlying carbide layer using a second mask.
Figure 14:
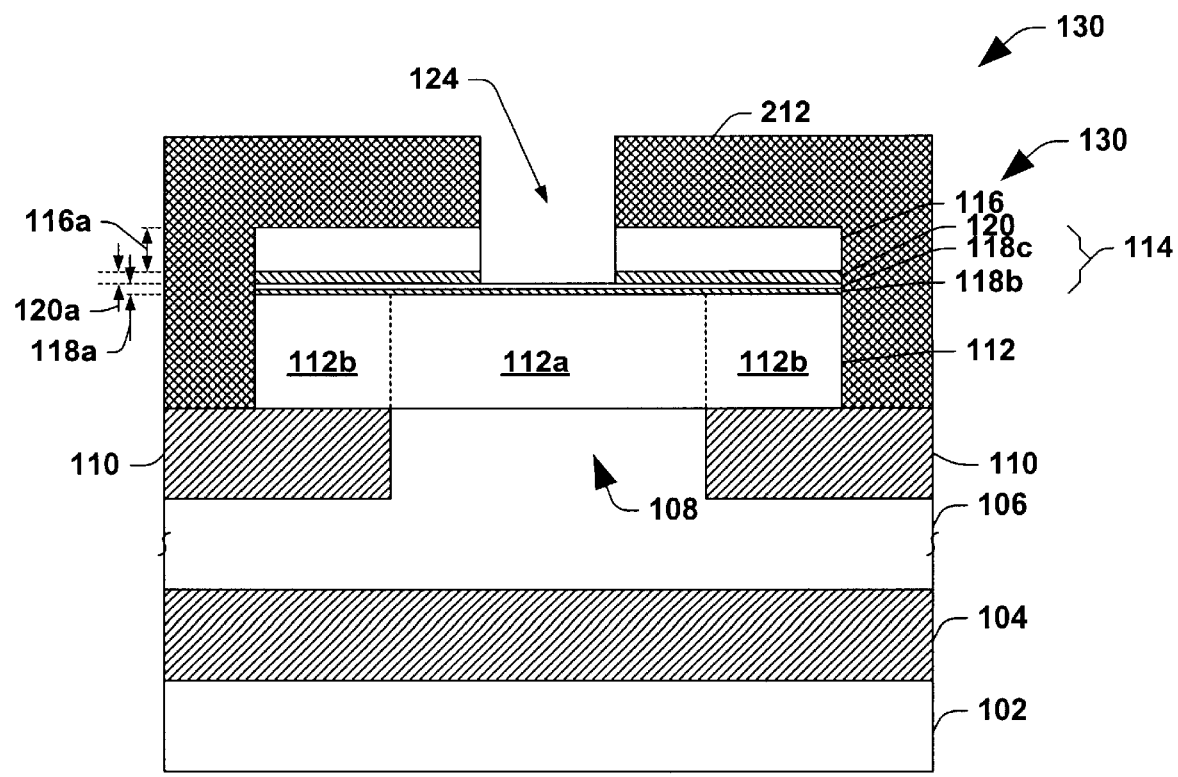
FIG. 14 is a partial side elevation view in section illustrating a patterned second anisotropic RIE etch process through an exposed portion of the carbide layer to expose a portion of the underlying first oxide layer.
Figure 15:
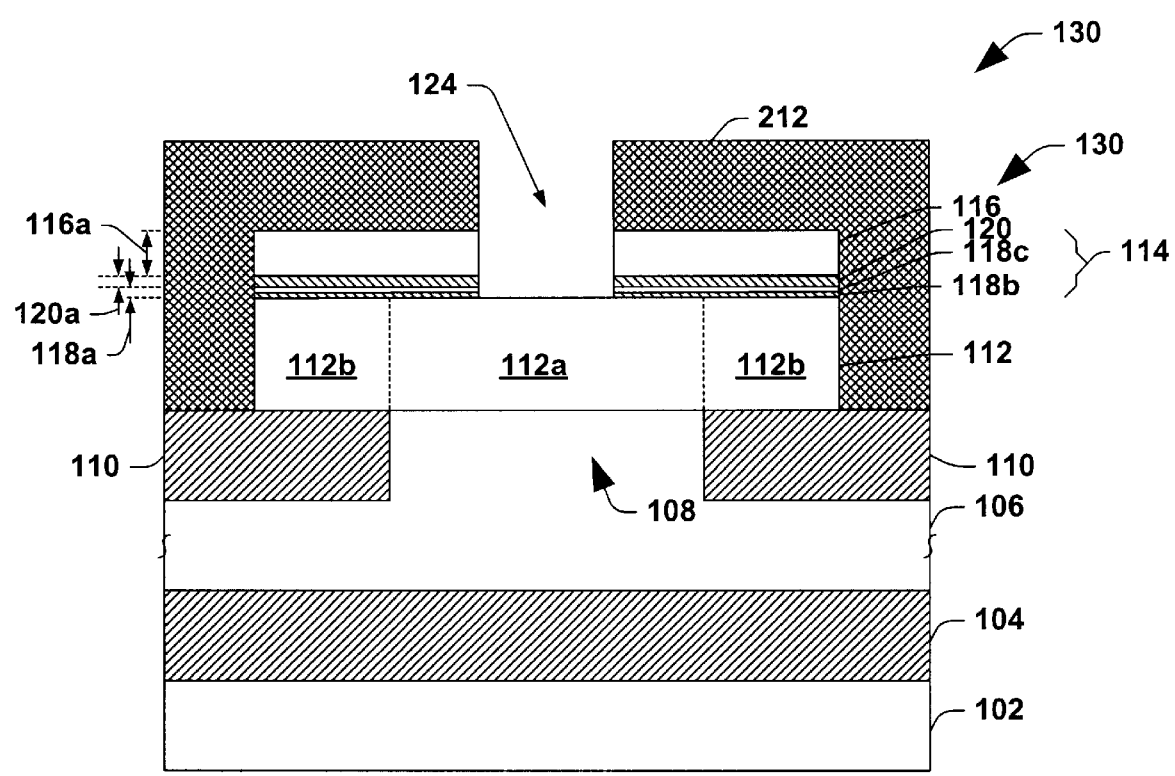
FIG. 15 is a partial side elevation view in section illustrating a patterned wet etch process through an exposed portion of the first oxide layer to expose a portion of the underlying base layer.

As illustrated in FIGS. 13–15, a contact opening is then formed through portions of the oxide layers 116, 118, and the SiC layer 120 to define an emitter-base contact for the transistor 130. In FIG. 13, a contact opening is formed in a portion of the upper oxide layer 116 using an anisotropic first reactive ion etch (RIE) process and a second mask 212, so as to expose a portion of the underlying SiC layer 120. The selective etch process employed in FIG. 13 may be done in any appropriate manner, preferably providing an etch selectivity of greater than 10:1 to the TEOS oxide of the oxide layer 116 over the material in the SiC layer 120. It is noted at this point that the etch selectivity possible using the SiC layer 120 as an etch stop is substantially better than was possible with the nitride layer 20 of the conventional device in FIG. 1 (e.g., etch selectivity of only about 3:1 or 4:1). Thus, the present invention facilitates overetching using the first RIE process 210 in order to ensure complete opening of the desired portion of the upper oxide later 116.

In FIG. 14, a second RIE process is used to further etch the contact opening by etching through the exposed portion of the SiC layer 120. The second RIE etch preferably provides a selectivity of SiC 120 over the underlying first oxide layer 118 of more than about 10:1, such as more than about 20:1, in order to expose a portion of the first oxide layer 118 without substantially damaging or otherwise affecting the underlying base layer 112. Thereafter in FIG. 15, a wet etch process is employed to remove a portion of the first oxide layer 118 to expose a portion of the underlying base layer 112. Because of the substantial etch selectivity between the SiC layer 120 and the underlying first oxide layer 118, the first oxide layer 118 can be very thin. Consequently, although the wet etch of the first oxide layer 118 is isotropic, an amount of undercutting and first oxide layer 118 variability is dramatically reduced, thereby improving substantially the gain or beta control of bipolar transistors over the prior art.

Figure 16:
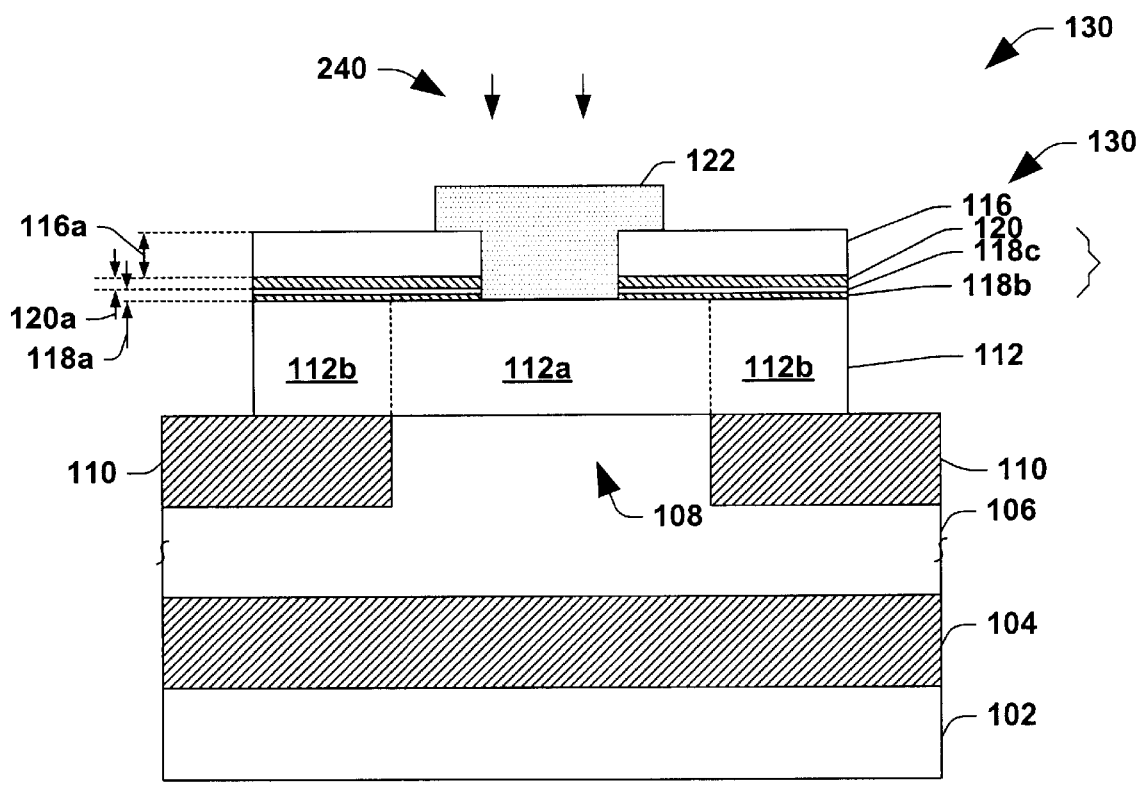
FIG. 16 is a partial side elevation view in section illustrating deposition of emitter polysilicon over the emitter-base dielectric stack and the exposed portion of the base layer.

In FIG. 16, the mask 212 is removed and a polysilicon emitter layer 122 is deposited and patterned using appropriate deposition and lithographic masking and etching processes and techniques as are known. The polysilicon emitter structure 122 is thereafter doped via an implantation process 240. The dopants in the emitter layer 122 are then thermally driven downward into the base layer 112 in order to form an emitter-base junction (not shown) therein, after which other back-end processing steps (not shown) may be performed in order to complete the device 130, such as formation of isolation and contact layers, etc.

Second Preferred Embodiment

In another implementation of the invention, the a-SiC:H layer (e.g., layer 120 of FIGS. 3 and 10–16 above) may be replaced with an a-BC:H layer, or alternatively with any combination of a-SiC:H and a-BC:H. The methodologies of the present invention, such as the above exemplary method 50 of FIGS. 2a and 2b, may be employed to form such a layer, for example, at step 64 of FIG. 2a.

Third Preferred Embodiment

Alternatively or in combination with the above embodiments and implementations, the upper TEOS oxide layer (e.g., the exemplary layer 116 of FIGS. 3 and 11–16 above) may be removed, wherein the thickness of the carbide layer (e.g. a-SiC:H, or a-BC:H, or combinations thereof, such as layer 120 in the above drawing figures) may be increased to the approximate sum of the original TEOS/carbide thickness.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of forming an emitter in a bipolar transistor, comprising:
   forming a collector region in a substrate;
   forming a base layer over at least a portion of the collector region;
   forming a first oxide layer over the base layer;
   forming a carbide layer over the first oxide layer;
   forming a second oxide layer over the carbide layer;
   selectively etching portions of the first and second oxide layers and the carbide layer to expose a portion of the base layer;
   depositing a polysilicon emitter layer over the exposed portion of the base layer; and
   doping at least a portion of the polysilicon emitter layer.

2. The method of claim 1, wherein forming the first oxide layer comprises:
   growing a thermal silicon oxide layer over the base layer, the thermal silicon oxide layer having a thickness of about 20 Å or more and about 50 Å or less; and
   depositing a first silicon oxide over the thermal silicon oxide layer to a thickness of about 50 Å using a plasma enhanced chemical vapor deposition process.

3. The method of claim 1, wherein forming the first oxide layer comprises depositing a first silicon oxide over the base layer, the first silicon oxide having a thickness of about 70 Å or more and about 100 Å or less.

4. The method of claim 3, wherein forming the carbide layer comprises depositing a silicon carbide layer over the first oxide layer.

5. The method of claim 4, wherein depositing a silicon carbide layer comprises depositing silicon carbide over the first oxide layer to a thickness of about 100 Å using a plasma enhanced chemical vapor deposition process.

6. The method of claim 4, wherein forming the second oxide layer comprises depositing a second silicon oxide over the carbide layer to a thickness of about 500 Å or more and about 1000 Å or less.

7. The method of claim 6, wherein depositing the second silicon oxide comprises depositing the second silicon oxide over the carbide layer to a thickness of about 500 Å or more and about 1000 Å or less using a plasma enhanced chemical vapor deposition process.

8. The method of claim 3, wherein forming the second oxide layer comprises depositing a second silicon oxide over the carbide layer to a thickness of about 500 Å.

9. The method of claim 1, wherein forming the second oxide layer comprises depositing a second silicon oxide over the carbide layer to a thickness of about 500 Å or more and about 1000 Å or less.

10. The method of claim 1, wherein forming the carbide layer comprises depositing a silicon carbide layer over the first oxide layer.

11. The method of claim 10, wherein depositing a silicon carbide layer comprises depositing silicon carbide over the first oxide layer to a thickness of about 100 Å.

12. The method of claim 7, wherein selectively etching portions of the first and second oxide layers and the carbide layer to expose a portion of the base layer comprises:
   etching a portion of the second oxide layer to expose a portion of the carbide layer using a first reactive ion etch process;
   etching a portion of the carbide layer to expose a portion of the first oxide layer using a second reactive ion etch process; and
   etching a portion of the first oxide layer to expose the portion of the base layer using a wet etch process.

13. The method of claim 1, wherein selectively etching portions of the first and second oxide layers and the carbide layer to expose a portion of the base layer comprises:
   etching a portion of the second oxide layer to expose a portion of the carbide layer using a first reactive ion etch process;
   etching a portion of the carbide layer to expose a portion of the first oxide layer using a second reactive ion etch process; and
   etching a portion of the first oxide layer to expose the portion of the base layer using a wet etch process.

14. The method of claim 13, wherein etching a portion of the second oxide layer comprises:
   forming a mask over the second oxide layer, the mask having an opening exposing a portion of the second oxide layer; and
   etching an exposed portion of the second oxide layer using a first reactive ion etch process having an etch selectivity to the second oxide layer over the carbide layer greater than about 10:1 to expose a portion of the carbide layer.

15. The method of claim 14, wherein etching a portion of the carbide layer comprises etching an exposed portion of the carbide layer using a second reactive ion etch process having an etch selectivity to the carbide layer over the first oxide layer greater than about 10:1 to expose a portion of the first oxide layer.

16. The method of claim 13, wherein etching a portion of the carbide layer comprises etching an exposed portion of the carbide layer using a second reactive ion etch process having an etch selectivity to the carbide layer over the first oxide layer greater than about 10:1 to expose a portion of the first oxide layer.

17. The method of claim 16, wherein etching a portion of the carbide layer comprises etching an exposed portion of the carbide layer using a second reactive ion etch process having an etch selectivity to the carbide layer over the first oxide layer greater than about 20:1 to expose a portion of the first oxide layer.

18. The method of claim 1, wherein forming the carbide layer comprises depositing one of silicon carbide and boron carbide over the first oxide layer.

19. The method of claim 1, wherein forming the carbide layer comprises depositing a combination of silicon carbide and boron carbide over the first oxide layer.

20. A method of forming an emitter-base dielectric stack in a poly emitter bipolar transistor, comprising:
forming a first oxide layer over a base layer;
forming a carbide layer over the first oxide layer;
forming a second oxide layer over the carbide layer;
selectively etching portions of the first and second oxide layers and the carbide layer to expose a portion of the base layer; and
forming a polysilicon emitter structure over the second oxide layer and the exposed portion of the base layer.

21. The method of claim 20, wherein forming the carbide layer comprises depositing a silicon carbide layer over the first oxide layer.

22. The method of claim 21, wherein depositing a silicon carbide layer comprises depositing silicon carbide over the first oxide layer to a thickness of about 100 Å.

23. The method of claim 20, wherein forming the first oxide layer comprises:
growing a thermal silicon oxide layer over the base layer, the thermal silicon oxide layer having a thickness of about 20 Å or more and about 50 Å or less; and
depositing a first silicon oxide over the thermal silicon oxide layer, the first silicon oxide having a thickness of about 50 Å.

24. The method of claim 23, wherein forming the first oxide layer comprises depositing a first silicon oxide over the base layer, the first silicon oxide having a thickness of about 70 Å or more and about 100 Å or less.

25. The method of claim 20, wherein selectively etching portions of the first and second oxide layers and the carbide layer to expose a portion of the base layer comprises:
etching a portion of the second oxide layer to expose a portion of the carbide layer using a first reactive ion etch process;
etching a portion of the carbide layer to expose a portion of the first oxide layer using a second reactive ion etch process; and
etching a portion of the first oxide layer to expose the portion of the base layer using a wet etch process.

26. The method of claim 25, wherein etching a portion of the second oxide layer comprises:
forming a mask over the second oxide layer, the mask having an opening exposing a portion of the second oxide layer; and
etching an exposed portion of the second oxide layer using a first reactive ion etch process having an etch selectivity to the second oxide layer over the carbide layer greater than about 10:1 to expose a portion of the carbide layer.

27. The method of claim 26, wherein etching a portion of the carbide layer comprises:
etching an exposed portion of the carbide layer using a second reactive ion etch process having an etch selectivity to the carbide layer over the first oxide layer greater than about 10:1 to expose a portion of the first oxide layer; and
stopping on the first oxide layer.

28. The method of claim 25, wherein etching a portion of the carbide layer comprises etching an exposed portion of the carbide layer using a second reactive ion etch process having an etch selectivity to the carbide layer over the first oxide layer greater than about 10:1 to expose a portion of the first oxide layer.

29. The method of claim 28, wherein etching a portion of the carbide layer comprises etching an exposed portion of the carbide layer using a second reactive ion etch process having an etch selectivity to the carbide layer over the first oxide layer greater than about 20:1 to expose a portion of the first oxide layer.

30. The method of claim 20, wherein forming the carbide layer comprises depositing one of silicon carbide and boron carbide over the first oxide layer.

31. A method of forming an emitter in a bipolar transistor, comprising:
forming a collector region in a substrate;
forming a base layer over at least a portion of the collector region;
forming an oxide layer over the base layer;
forming a carbide layer over the oxide layer;
selectively etching portions of the oxide and carbide layers to expose a portion of the base layer;
depositing a polysilicon emitter layer over the exposed portion of the base layer; and
doping at least a portion of the polysilicon emitter layer.

32. The method of claim 31, wherein forming the carbide layer comprises depositing one of silicon carbide and boron carbide over the oxide layer.

* * * * *